United States Patent [19]

Breneman et al.

[11] Patent Number: 5,134,374
[45] Date of Patent: Jul. 28, 1992

[54] MAGNETIC FIELD CONTROL APPARATUS

[75] Inventors: Bruce C. Breneman, San Diego; J. Wesley Parker, Escondido; Raymond E. Sarwinski, San Diego, all of Calif.

[73] Assignee: Applied Superconetics, San Diego, Calif.

[21] Appl. No.: 555,269

[22] Filed: Jul. 18, 1990

Related U.S. Application Data

[63] Continuation-in-part of Ser. No. 360,028, Jun. 1, 1989, Pat. No. 4,943,774.

[51] Int. Cl.⁵ .............................................. G01R 33/20
[52] U.S. Cl. .................................... 324/319; 324/318; 335/296
[58] Field of Search ............... 324/319, 318, 320, 307; 335/296, 297, 298, 302, 304, 306

[56] References Cited

U.S. PATENT DOCUMENTS

| | | | |
|---|---|---|---|
| 4,695,802 | 9/1987 | Zijlstra | 324/319 |
| 4,766,378 | 8/1988 | Danby et al. | 324/319 |
| 4,943,774 | 7/1990 | Breneman et al. | 324/318 |
| 4,980,641 | 12/1990 | Breneman et al. | 324/318 |

Primary Examiner—Hezron E. Williams
Assistant Examiner—Louis M. Arana
Attorney, Agent, or Firm—Nydegger & Associates

[57] ABSTRACT

A magnetic field control apparatus for establishing a uniform field of flux for use in magnetic resonance imaging has a pair of opposed magnetic poles mounted on end plates of variable thickness. A pair of substantially flat parallel pole faces are attached to the facing surfaces of the magnetic poles. The end plates are supported by connecting members. In addition, there is included a plurality of segments movably mounted to the periphery of the pole face for adjusting the density of the magnetic field. The top and bottom end plates may have substantially identical concave portions on the opposite outside surfaces thereof. The magnetic poles and pole faces are preferably in the shape of thin, flat, circular plates. In one embodiment, there is included one or more inner segmented concentric rings for further adjustably controlling the homogeneity of the uniform magnetic flux in the air gap between the opposing pole faces into which a patient can be inserted for magnetic resonance imaging. In another embodiment, the end plates are shaped so that the aggregate cross-sectional area taken in any plane perpendicular to the direction of the return flow of flux is substantially constant.

15 Claims, 4 Drawing Sheets

MAGNETIC FIELD CONTROL APPARATUS

FIELD OF THE INVENTION

This is a continuation-in-part of prior co-pending patent application Ser. No. 360,028, filed Jun. 1, 1989, now U.S. Pat. No. 4,943,774. This invention relates generally to a magnetic field control apparatus for controlling the uniformity of a magnetic field across a large air gap. More specifically, the invention relates to an apparatus which utilizes permanent magnets for nuclear magnetic resonance (NMR) imaging. The present invention is particularly, though not exclusively, useful for generating an intense yet highly uniform magnetic field, into which a patient can be placed for magnetic resonance imaging.

BACKGROUND OF THE INVENTION

Generation of an intense highly uniform magnetic field is required for nuclear magnetic resonance (NMR) imaging. In NMR imaging, there is the ability to form images of biological tissue in vivo. With this ability, NMR imaging of humans for medical diagnostic purposes can be utilized for the early detection of tumors and the like. The NMR phenomenon is a result of the magnetic properties of atomic nuclei and the ability to observe nuclear spin distributions in the presence of a magnetic field. The magnetic field needed for NMR imaging can be generated by electromagnets or permanent magnets.

Different types of magnet systems have been proposed and utilized in an attempt to obtain a highly uniform field, and still realize a reasonable initial cost, simplify site preparation, control cost of operation, and minimize maintenance requirements. Specifically, the types of magnets used for this purpose include resistive magnets, superconducting magnets and permanent magnets. Of help in evaluating these magnets are the observations of W. Oldendorf in his article "Nuclear Magnetic Resonance and Correlative Imaging Modalities," published in the *Society of Nuclear Medicine* pp. 45–54, 1983, wherein he compares the advantages and disadvantages of resistive, superconducting and permanent magnets for human NMR imaging. In this publication, Oldendorf notes that superconducting magnets have the advantage of a strong field with high uniformity. He also notes they are, however, expensive to buy and maintain, and that they typically have a large fringe field. Furthermore, they require extensive site preparation. Moreover, they generate only a longitudinal field and require a vacuum and the consequent problems associated with the handling of liquified gasses. In comparison, resistive magnets can also have good uniformity and generate a transverse field. Moreover, they are relatively inexpensive and require no vacuum or handling of gasses. Unfortunately, the strength of resistive magnets is limited and they require an elaborate and costly power and water supply. In addition, they have large unwanted fringe fields and require extensive site preparation. Lastly, in comparison, permanent magnets are inexpensive, have minimum site preparation requirements, generate a minimal unwanted fringe field, and have no power supply, liquified gas handling or vacuum requirements. Their disadvantages are, however, that permanent magnets have limited field strength, temporal instabilities, are very heavy, and have a field whose uniformity does not meet industry requirements to date. Nevertheless, permanent magnets appear to be a newly developing, cost effective solution for NMR imaging.

As a solution to the problem of creating a uniform and homogeneous flux field for NMR imaging, a general design of a permanent magnet NMR structure has been proposed by Oldendorf which utilizes an external frame of iron supporting two opposed permanent magnets. This structure is shown in FIG. 1 as prior art in which a structure 10 is disclosed. This structure 10 supports two permanent magnets 12 which are oppositely charged, and which have respective iron pole faces 14 with topographies that are intended to enlarge the useful uniform region 16 of flux into which the patient 18 may be placed.

To solve the uniformity problem when using permanent magnet systems for NMR tomography, other authors have proposed various types of systems. Unfortunately, most systems, in order to obtain the field uniformity desired, require an enclosed magnetic field. An enclosed field, however, is not practical as it limits the ease with which the patient can be positioned in the magnetic field. See, for example, "Permanent Magnetic Systems for NMR Tomography" by H. Zijlstra, *Philips Journal of Research*, Volume 40, No. 5, 1985, pp. 259–288. In this article, it is noted that the standard requirement for a magnet system is that it be a full-body magnet with an access diameter of at least one meter, and a magnetic field nonuniformity of no more than one hundred (100) ppm within a sphere of one-half (0.5) meters diameter. As a practical matter, most NMR devices barely exceed these requirements.

Various attempts to solve some of the problems involving permanent magnets have been made which include substantially parallel flat plates that support opposed permanent magnets and which are coupled together by a plurality of rod-like yoke portions. Such a device is disclosed in U.S. Pat. No. 4,672,346 to Tuho Myamoto. For several reasons, however, such devices do not directly address the problem of flux leakage.

Apart from the flux leakage problem, various attempts have also been made to obtain uniform flux fields by varying the pole face topography to attain homogeneity of the flux. One known method which accomplishes some degree of control involves providing a peripheral annular-shaped rim which is positioned on the pole face of the magnet. With this method the positions of the central pole faces and rims can be adjusted independently in attempts to establish a uniform flux field. However, limitations to uniformity have been observed as a result of even slight asymmetries in the geometry of the device. Furthermore, imperfections in the iron or other material being used for the magnet can affect the uniformity in magnetization. See for example, the article entitled "Field Homogeneity and Pole Distribution," by J. D. Bjorken and F. Bitter, published in the *Review of Scientific Instruments*, Volume 27, No. 12, Dec. 1956, pp. 1005–1008.

Regardless of the type of magnet used to generate the flux field for NMR purposes, the field needs to have several desirable characteristics. Most importantly, the flux field needs to be uniform and homogeneous in the space where NMR is to be accomplished (i.e. all lines of flux need to be substantially parallel to each other). Also, for overall efficiency, the generation of the flux field should be accomplished as efficaciously as possible. The present invention also recognizes that flux field uniformity can be improved by incorporating shims on the periphery of the magnet's pole face which can be individually adjusted to collectively establish an effective peripheral rim.

Accordingly, it is an object of the present invention to provide an apparatus which can be controlled to achieve a large, highly uniform magnetic field suitable for use in NMR imaging. It is another object of the present invention to provide an apparatus for minimizing the leakage of flux into a fringe field. It is another object of the present invention to provide a magnetic field control apparatus which is relatively inexpensive to manufacture, install, operate and maintain while achieving reliable results in operation. It is another object of the present invention to provide a system and apparatus for adjustably controlling the magnetic field desired. Other objects of the present invention will become apparent in the full description of the invention taken in conjunction with the drawings set forth below.

SUMMARY OF THE INVENTION

A preferred embodiment of the magnetic field control apparatus includes a pair of opposed magnetic poles spaced apart to form a magnetic field, a pair of substantially flat, parallel pole faces attached to the poles defining an air gap, end plates for supporting the poles and providing a return path for flow of flux, and supporting columns connecting the end plates. A plurality of segments are movably mounted on the periphery of the end plates. The end plates have a transition portion at the junction of the end plates and supporting columns comprising stepped laminations. In another embodiment, inner rings are concentrically mounted to the pole faces which are generally in the shape of thin, flat, circular plates. In another embodiment, the end plates have a variable thickness presenting an aggregate cross-sectional area, taken in any plane perpendicular to the direction of the return flow path, which is substantially constant.

In yet another embodiment, each pole face has a respective carbon steel outer ring mounted on the periphery of the pole face. Also, each pole face has at least one inner ring of carbon steel mounted on the pole face, with each inner ring being concentric with the outer ring. Radial grooves are formed on each pole face to divide the pole face and its rings into segments. The segments of the inner rings of the respective pole faces are radially positioned to establish an area between the poles through which a relatively uniform magnetic field permeates.

The novel features of this invention, as well as the invention itself, both as to its structure and its operation, will be best understood from the accompanying drawings, taken in conjunction with the accompanying description, in which similar reference characters refer to similar parts, and in which:

DESCRIPTION OF THE PREFERRED EMBODIMENTS

Figure 1:
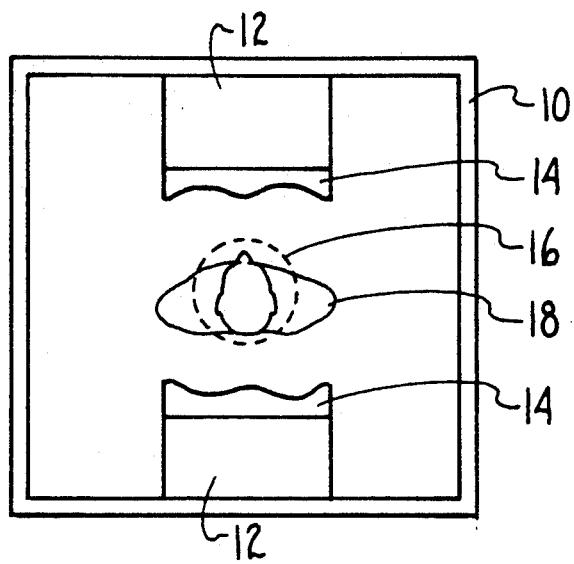
FIG. 1 is an end view of a permanent magnet NMR structure showing a patient positioned therein as shown in the prior art.
Figure 2:
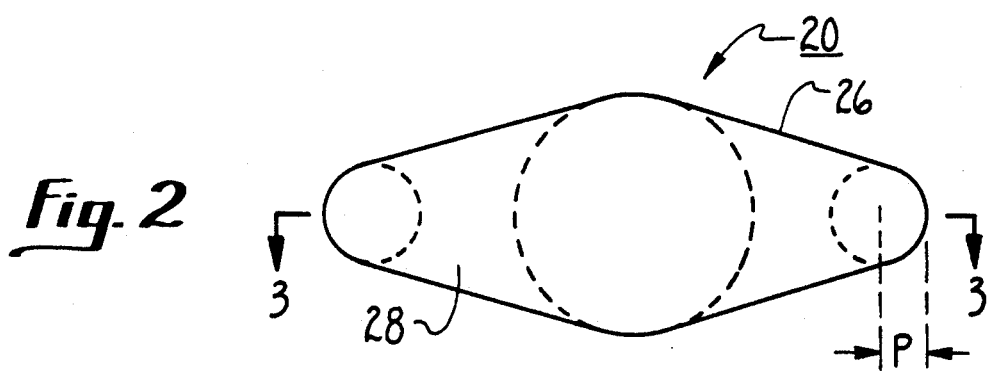
FIG. 2 is a top plan view of one embodiment of a magnetic field control apparatus in accordance with the present invention.
Figure 3:
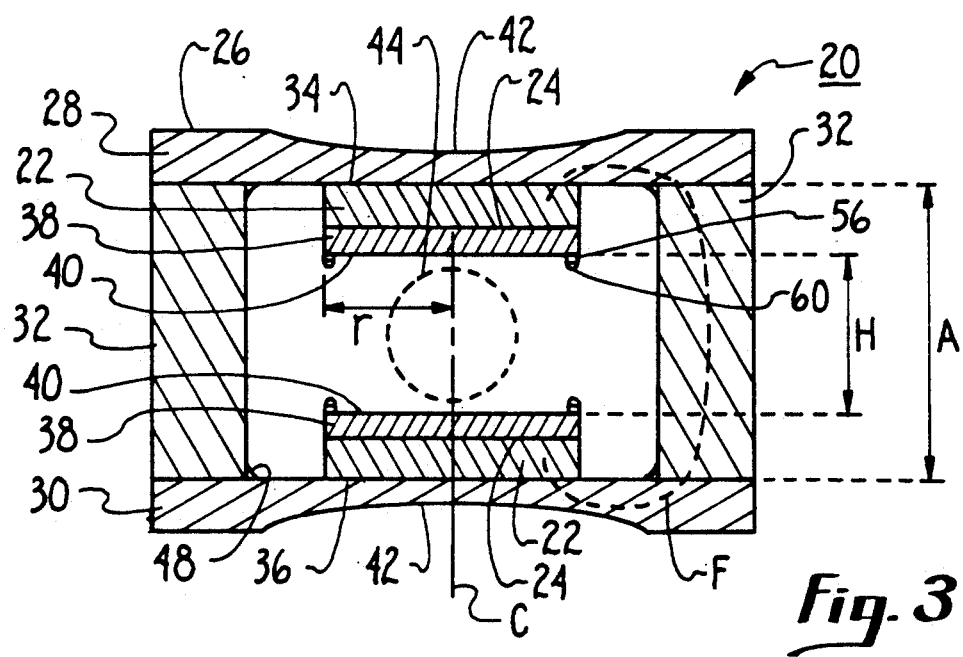
FIG. 3 is a side cross-sectional view of the apparatus of FIG. 2.

Referring now to FIGS. 2 and 3, there is shown a magnetic field control apparatus generally designated 20. The magnetic field control apparatus 20 comprises a pair of opposed magnetic poles 22. The magnetic poles 22 may be permanent magnets, resistive magnets or superconductive magnets, although with the embodiment shown herein, it is preferable to use permanent magnets to obtain the maximum benefits of the present invention. The magnetic poles 22 are polarized so that the facing surface 24 of each magnetic pole 22 has opposite polarities. The magnetic poles 22 are shown as large discs of permanently magnetic material. The magnetic poles 22 are supported by a frame 26 having a top end plate 28 and a bottom end plate 30. A plurality of connecting members 32 are provided for supporting the top end plate 28 and bottom end plate 30, as well as for providing a return flow path for magnetic flux as will be further described hereinbelow. Top end plate 28 and bottom end plate 30, as well as connecting members 32 are made of a ferrous material, such as iron or steel, for serving as a return path for the flux being driven through the apparatus.

The pair of magnetic poles 22 are spaced apart in order to form a magnetic field therebetween. The magnetic poles are preferably comprised of ferrite or other permanent magnetic material. The top end plate 28 and bottom end plate 30 each have inner facing surfaces 34 and 36, respectively, to which the pair of magnetic poles 22 are mounted. A pole face 38 is attached to the facing surface 24 of each of the pair of opposed magnetic poles 22. Each pole face 38 has a pole face surface 40 which is substantially flat. The pole face surfaces 40 also are parallel to one another. The material utilized for the pole face is a ferrous material, such as high grade iron or steel, and the pole face surface 40 is also preferably a disc which is precision-machined flat. The material utilized for the frame 26 is preferably also a ferrous material which allows the flow of flux through it, and which keeps the amount of leakage flux to a minimum. High grade iron is a suitable material. Cold rolled steel may be utilized for the connecting member 32. In the embodiment shown in FIGS. 2 and 3, the connecting member 32 is in the form of a cylindrical pillar or column.

Referring further to FIG. 3, it can be appreciated that top end plate 28 and bottom end plate 30 each have a concave portion 42. Concave portion 42 has a depth in the embodiment shown which is approximately one-half the thickness of each of end plates 28 and 30. The concave portion assists in the flow of return flux.

The pair of pole faces 38 forms an air gap between them of height H, within which the desired uniform flux within field 44 is generated by the apparatus. While the field of flux in the air gap comprises generally parallel flux lines, the uniform portion of flux field 44 preferably encompasses in the shape of a sphere, in which there is uniformity of the flux lines in three dimensions. Accordingly, it is important that the device be symmetrical where feasible.

As can further be seen from the embodiments shown in FIGS. 2 and 3, the pole faces 38 are in the shape of thin, flat, circular plates, as are the magnetic poles 22, and each has the same radius r from the central axis C. Radius r is approximately equal to the height H of the air gap. In the preferred embodiment shown, the distance A separating the top end plate 28 and the bottom end plate 30 is approximately twice that of the height H of the air gap. In addition, the connecting members 32 shown as cylindrical pillars have a radius P which is dependent on the permanent magnetic material utilized and the field strength. In the embodiment shown, the radius P is approximately thirty to forty percent (30–40%) of the radius R of magnetic poles 22. There is also shown in FIG. 3 a hypothetical flux line F which shows the path of the return flow of flux through the frame 26.

Figure 4:
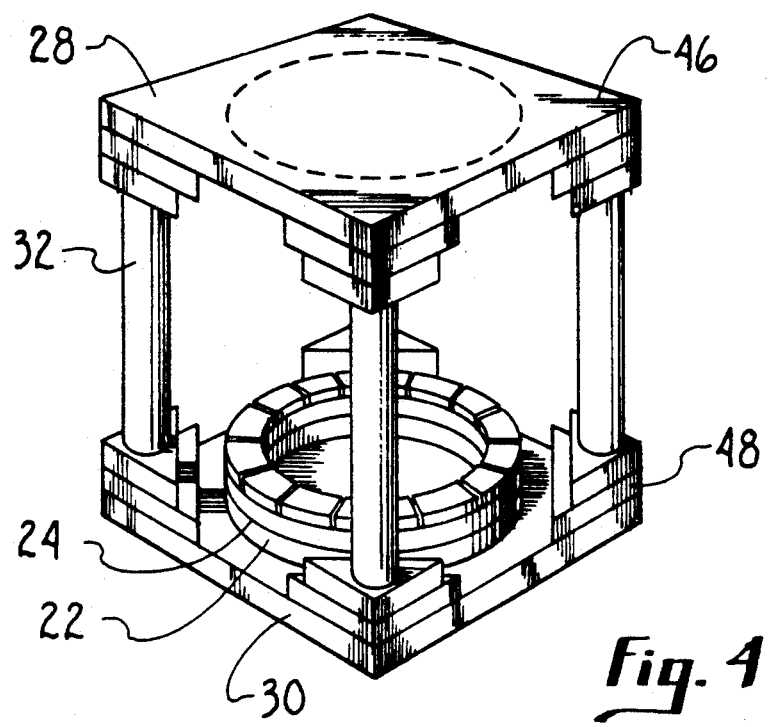
FIG. 4 is a perspective view of another embodiment of the magnetic field control apparatus in accordance with the present invention.
Figure 5:
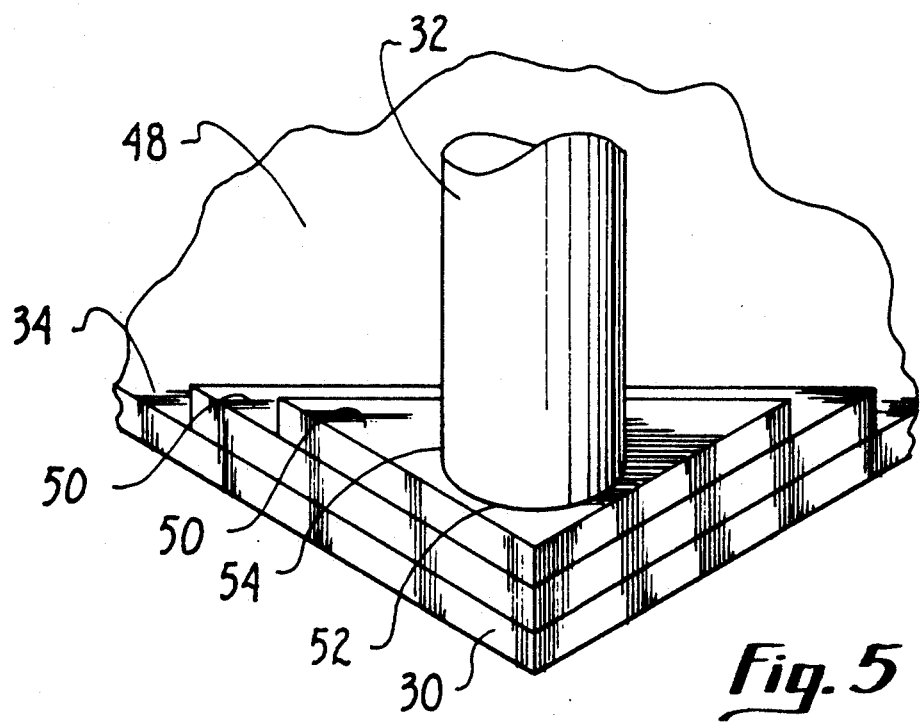
FIG. 5 is a close-up perspective view of a corner portion of the embodiment shown in FIG. 4.

There is shown in FIG. 4 an alternative embodiment of the present invention in which the top end plate 28 and bottom end plate 30 are generally in the shape of a square, and the connecting members 32 are generally in the shape of four parallel cylindrical pillars or columns positioned outside the magnetic poles 22 and facing surfaces 24 at corner portions 46 of top end plate 28 and bottom end plate 30. The top end plate 28 and bottom end plate 30 are of variable thickness, and there is shown a transition portion 48 at the junction of each of the connecting members 32 and the corners 46 of each end plate 28 and 30. As further shown in FIG. 5, the transition portion 48 is comprised of stepped laminations 50. The stepped laminations 50 are intended to provide a gradual transition between the connecting member 32 and inner facing surface 34 by having the bottom 52 of connecting member 32 setting on lamination 50. This transition tends to smooth the flow of flux so that there is not an abrupt angle between inner facing surface 34 and sidewall 54 of connecting member 32, which would tend to allow leakage flux to escape and contribute to an unwanted fringe field. While two step laminations 50 have been shown, it can be appreciated that more than two laminations could be utilized to provide a finer stepwise transition, with the ultimate being a smooth surface comprising the transition portion 48 as shown in FIG. 3. However, for ease of manufacture and cost savings, laminations are found to be convenient. The material utilized would also be the same material as the remainder of the frame which assists in the return flux flow path, namely iron and steel. It can also be seen that laminations 50 may be changed in shape in order to more clearly accommodate the return flux flow field shape.

One feature which may be included in the present apparatus is that if a cross section is taken through the structure in a plane perpendicular to the direction of the return flow of flux F, the aggregate cross-sectional area is substantially constant throughout. In other words, the aggregate of the cross-sectional area of the four pillars taken in a plane perpendicular to the flow of flux F remains constant for any perpendicular plane chosen.

This structure assists in assuring that there is minimum flux leakage to eliminate fringe flux. At the same time, such construction allows less material to be utilized resulting in lower weight of the device, an advantage in requiring less site preparation, less shipping and handling costs, and less production costs. Sufficient material is utilized, however, to avoid saturation of the material. The amount of the cross-sectional area is a function of the magnetic field strength; the stronger the field the more area is required to achieve minimum leakage. This feature can be more fully appreciated by referring now to FIGS. 4 and 5.

Figure 6:
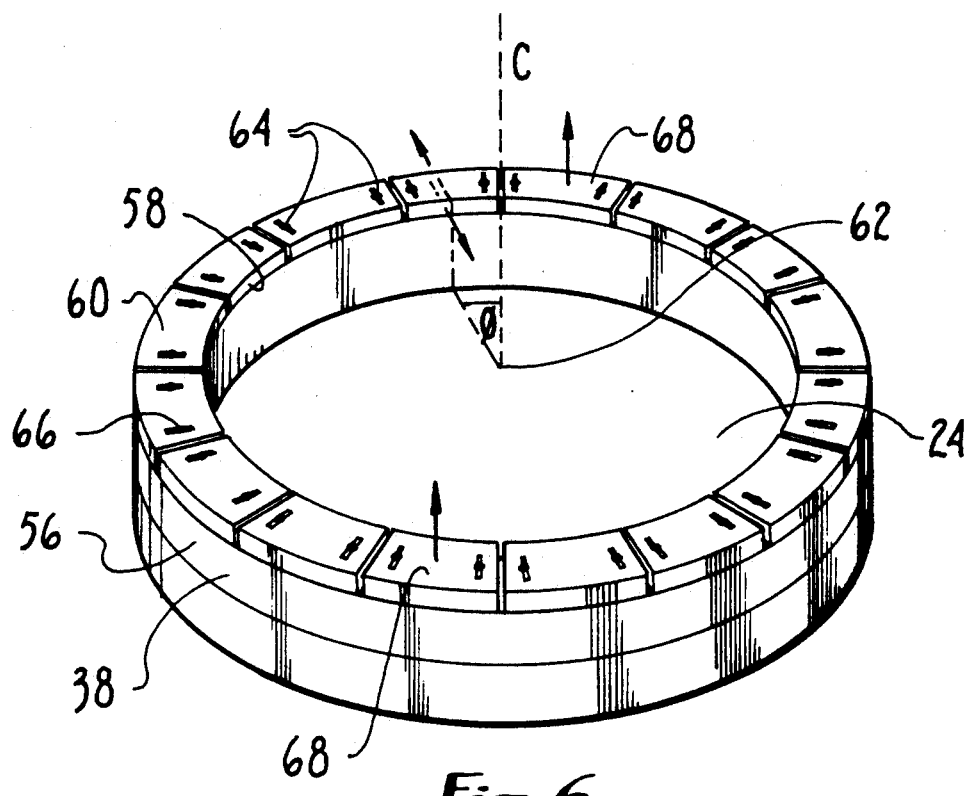
FIG. 6 is a close-up perspective view of an embodiment of the magnetic pole face and related structure in accordance with the present invention.

Further referring to FIGS. 3, 4 and 6, there is shown a preferred embodiment of the portion of the apparatus respecting the pole faces. In FIG. 6 in particular, there is shown a pole face 38 upon which is mounted annular member 56 positioned along the periphery thereof. The annular member 56 in the embodiment shown is in the form of a ring having an essentially rectangular cross section, and having an outside perimeter aligned with the outside perimeter of pole face 38. Mounted on the top side 58 of annular member 56 are a plurality of segments 60. Each segment 60 is movably mounted on the annular member 56. Although any number of segments 60 could be used, preferably there is an even number of segments 60. In the embodiment shown, there are sixteen segments 60 in connection with each pole face. The segments 60 are removable, and are also adjustably movable radially outward from and inward toward the center 62 of pole face 38. The segments 60 can be replaced by thinner or thicker segments, and a plurality of segments may be layered to achieve a desired volume, each segment being of varying thickness as desired. Each segment 60 has one or more slots 64 and may be held in place, for example, by adjusting screws 66.

Different methods of adjusting the segments, also called shimming, involves (i) moving the segments inward or outward radially, each segment being defined in its relative radial position by the angle $\theta$, as shown in FIG. 6, (ii) removing the segments, or (iii) altering the volume of the segments by replacing a segment with laminated segments that can be removed and/or added.

One method of shimming is called Tesseral shimming. Tesserals refer to the off-axis coefficients of the known Legendre polynomial which describes the x,y,z gradients of the magnetic field. The Tesseral coefficients are comprised of x, y, $x^2-y^2$, zxy... In Teserral shimming, removing a segment, or translating a segment outward radially at a given angle reduces the magnetic flux density at that prescribed angle. On the other hand, adding a segment, or translating a segment inward radially, produces the converse result and increases the magnetic flux density or field at that prescribed angle $\theta$. Thus, fine tuning of these Tesseral perturbations can be done by replacing the segment with a segment composed of several laminations which can individually be adjusted to achieve the desired magnetic field density, and thus control the homogeneity of the magnetic field. Zonals refer to the On axis coefficients in the Legendre polynomial which comprise z, $z^2$, $z^3$, $z^4$, . . .

Another method of shimming involves zonal shimming. In zonal shimming, segments may be added to both of opposing matched segments 68 and 68', changing the thickness of the segment in the direction shown by the arrow Z, which produces a zonal perturbation to the field which is an exponential function of the variation in the thickness of segments 68 and 68'. Adding a segment to vary the thickness of only the segment 68 produces an exponential and directly proportional gradient to the magnetic field. The Z axis, again, is defined as parallel to the flux lines between the pole faces as shown by the direction of arrow Z. Thus, it can be appreciated that the present invention enables control of the magnetic field strength by making appropriate adjustments in terms of Tesseral segment adjustments as well as zonal segment adjustments to arrive at the desired field density and homogeneity.

Figure 7:
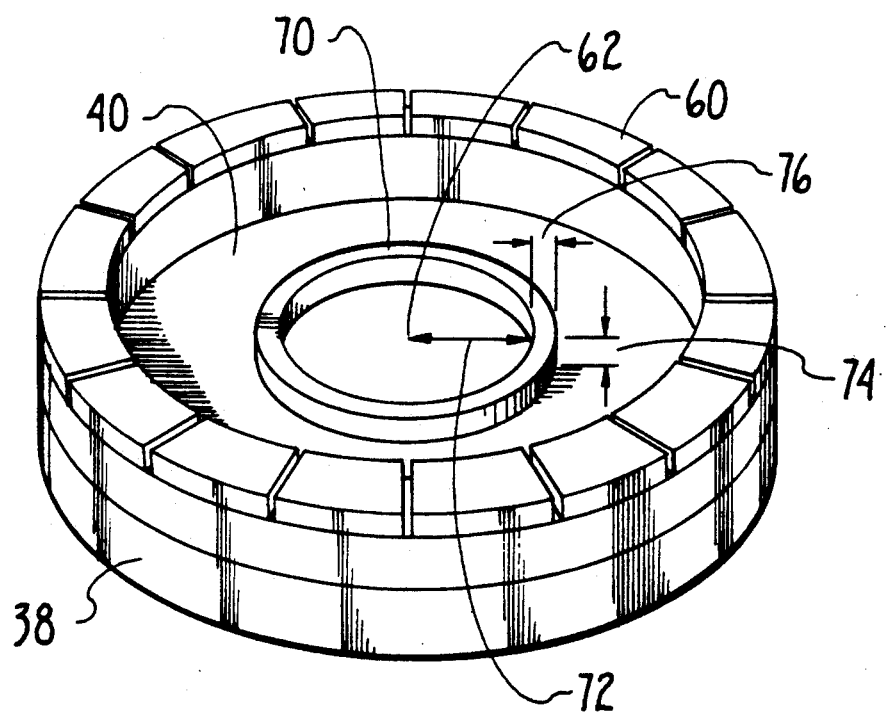
FIG. 7 is a close-up perspective view of another embodiment of the magnetic pole face and related structure in accordance with the present invention.

Referring now to FIG. 7, there is shown another embodiment of the present invention wherein there is included on the pole face surface 40 of pole face 38 an inner concentric ring member 70, of a specified radius 72, about the center 62 of pole face 38. The inner concentric ring member 70 is made of a ferrous material, such as iron, a height 74 and a thickness 76. The inner concentric ring member 70 has a generally rectangular cross section. By varying the radius 72, height, 74, and thickness 76, various perturbations in the uniformity of the magnetic field within the air gap can be achieved. In addition, a plurality of inner concentric ring members 70 can be utilized of varying radii, in conjunction with the segments 60, to achieve even additional homogeneity in the desired magnetic flux density for the particular application desired. It has been found through experimentation that in the construction of the present invention a magnetic field with a nonuniformity of no more than forty (40) ppm in the operational volume, typically a thirty (30) centimeter diameter sphere, has been achieved.

For example, placing symmetric, concentric inner rings on both the upper and lower pole face shims out the even order axial (z) zonal perturbations to the field. In other words, symmetric placement of the inner rings shims out $z^2$, $z^4$ and $z^6$ error fields. Placing a concentric inner ring on only either the top or bottom pole face shims out the odd as well as the even order axial (z) zonal perturbations. In other words, such placement of an inner ring shims out the relatively weak z, $z^3$, $z^5$ error fields in addition to the $z^2$, $z^4$ and $z^6$ error fields of the Legendre polynomial magnetic field function.

Figure 8:
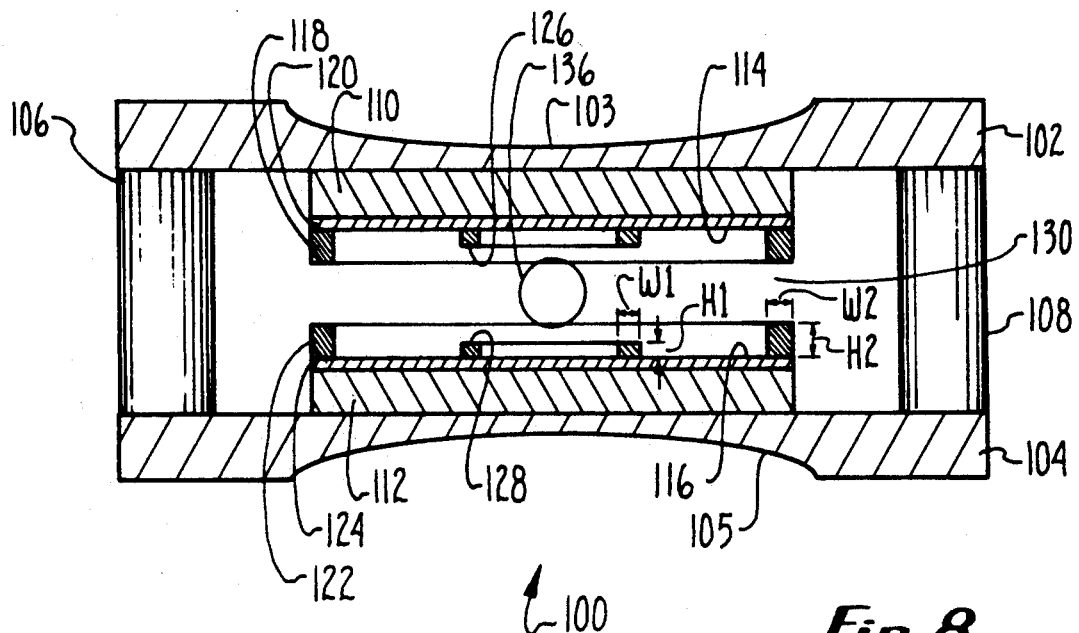
FIG. 8 is a cross-sectional view of an alternative embodiment of the novel permanent NMR apparatus as would be seen along the line 3—3 in FIG. 2.

Now referring to FIG. 8, an alternative permanent NMR apparatus is shown, generally designated 100. Apparatus 100 has end plates 102, 104, each of which is fixedly attached to supporting rods 106, 108. End plates 102, 104 are respectively formed with concave portions 103, 105, which are configured and which function substantially the same as concave portion 42 shown in FIG. 3. A magnetic pole 110 is fixedly attached to end plate 102, while a magnetic pole 112 is fixedly attached to end plate 104. Poles 110 and 112 are respectively formed with pole faces 114, 116. An outer ferromagnetic ring 118 is fixedly mounted to the periphery 120 of pole face 114, while an outer ferromagnetic ring 122 is fixedly mounted to the periphery 124 of pole face 116. Further, FIG. 8 shows that an inner ferromagnetic ring 126 is also mounted on pole face 114 concentrically with outer ring 118. In a similar manner, an inner ferromagnetic ring 128 is mounted on pole face 116 concentrically with outer ring 122. In the alternate embodiment shown in FIG. 8, the height H1 and width W1 of inner ring 128 is approximately one quarter (0.25) inch, although this size may vary as more fully disclosed below. It is to be understood that the configuration of inner ring 126 is in all essential respects identical to the configuration of inner ring 128. Also, the height H2 and width W2 of outer ring 122 are respectively approximately three (3) inches and one and three-quarters (1.75) inches. It is to be further understood that the configuration of outer ring 118 is in all essential respects identical to the configuration of outer ring 122. Preferably, the ferromagnetic material which makes up the rings 118, 122, 126, 128 is carbon steel. Finally, an air gap 130 is shown formed between pole faces 114, 116.

Figure 9:
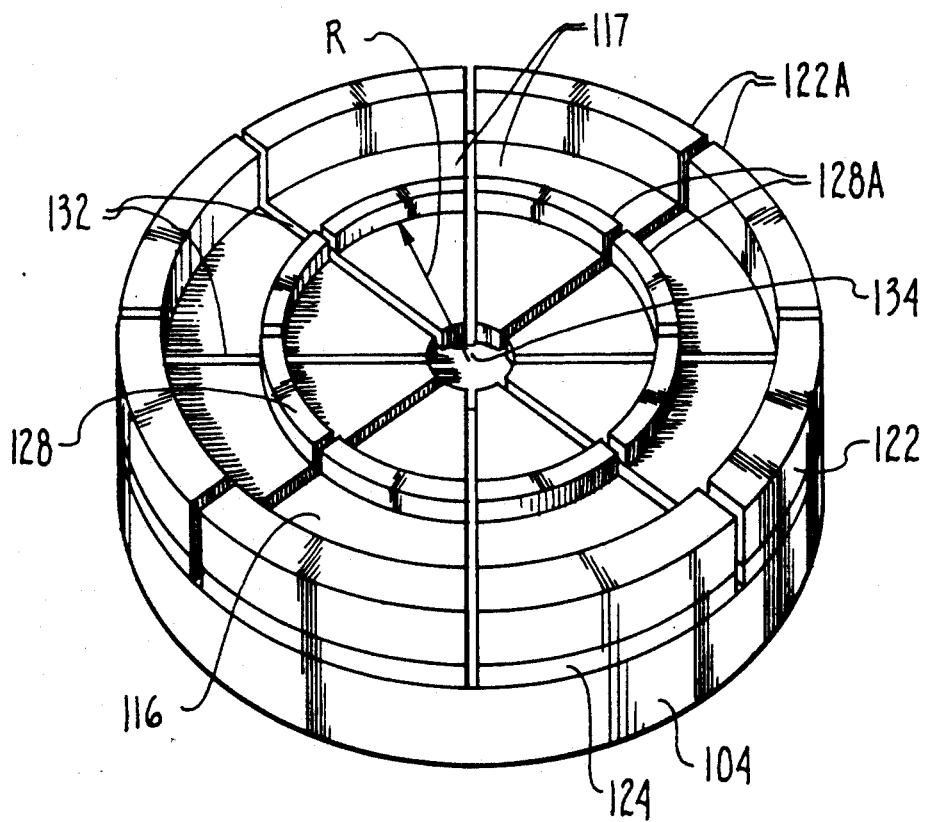
FIG. 9 is a perspective view of a single magnet of the embodiment of the novel permanent NMR apparatus shown in FIG. 8.

Now referring to FIG. 9, the details of a single pole may be seen. While FIG. 9 shows pole 104, it is to be understood that the configuration of pole 102 is in all essential respects identical to the configuration of pole 104. As shown, pole face 116 is divided into a plurality of pie-shaped segments 117 by radial grooves 132. Also, outer ring 122 and inner ring 128 are divided along grooves 132 into a plurality of arcuate segments 122a, 128a, respectively, which, as seen in FIG. 8, are rectangular in cross section. FIG. 9 shows that the grooves 132 terminate in a central hub 134. Outer ring 122 is fixedly mounted on periphery 124 of pole face 116, while inner ring 128 is formed on pole face 116 concentrically with outer ring 122. It is to be understood that the radius R of inner ring 128 is established to achieve an area 136 in air gap 130, shown in FIG. 8, through which a relatively uniform magnetic field permeates. Importantly, as R is varied, H1 and W1 of inner ring 128 will also be proportionally varied.

While FIGS. 8 and 9 show that each pole face 114, 116 has a single inner segmented ring 126, 128, respectively, additional inner rings (not shown) may be concentrically formed on each pole face. More particularly, each pole face may have a plurality of concentric segmented inner rings formed thereon, with each inner ring being in all essential respects shaped identically to ring 128.

While the particular magnetic field control apparatus as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

What is claimed is:

1. A magnetic field control apparatus for use in magnetic resonance imaging, which comprises:

a first end plate, a second end plate, and means for connecting said first end plate to said second end plate;

a pair of opposed, parallel magnetic poles respectively mounted to facing surfaces of said first and second plates, and spaced apart to form a magnetic field therebetween;

a pair of substantially flat, parallel pole faces respectively attached to the facing surface of each of said magnetic poles to form an air gap between said pole faces, each of said pole faces being formed with a plurality of radial grooves to divide each of said pole faces into a plurality of pie-shaped segments; and a plurality of concentric rings mounted onto each of said pole faces, said rings being divided along said grooves into a plurality of segments, said segments being radially positioned on respective said pole faces to establish an area of substantially uniform magnetic field in said air gap.

2. A magnetic field control apparatus as recited in claim 1, wherein each of said rings has an even number of said segments.

3. A magnetic field control apparatus as recited in claim 2, wherein each of said rings has eight segments.

4. A magnetic field control apparatus as recited in claim 1, wherein said segments of each respective said ring have substantially identical shapes.

5. A magnetic field control apparatus as recited in claim 1, wherein each of said segments is arcuate is shape.

6. A magnetic field control apparatus as recited in claim 1, wherein one of said rings is an outer ring mounted on the periphery of respective said pole face and one of said rings is an inner ring mounted concentrically with said outer ring on said pole face.

7. A magnetic field control apparatus as recited in claim 1, wherein said pole face and said segments are made of ferrous material.

8. A magnetic field control apparatus as recited in claim 6, further comprising a plurality of said inner rings, each of said inner rings being mounted on a respective said pole face concentrically with respective said outer ring.

9. A magnetic field control apparatus for use in magnetic resonance imaging, which comprises:
   a first magnetic pole and a second magnetic pole;
   means attached to said poles for holding said poles parallel and spaced-apart to form an air gap between said poles; and
   a first pole face attached to said first pole and a second pole face attached to said second pole, said pole faces being oriented toward each other, each of said pole faces having a periphery, each of said pole faces having an outer ring of ferromagnetic material fixedly attached to respective said pole face adjacent respective said periphery and at least one inner ring of ferromagnetic material mounted on respective said pole face concentrically with respective said outer ring, said pole faces being formed with radial grooves, each of said rings being divided into a plurality of segments along said grooves, said segments of said inner ring being radially positioned on said pole face to establish a substantially uniform magnetic field within a portion of said air gap.

10. A magnetic field control apparatus as recited in claim 9, wherein each of said rings has an even number of said segments.

11. A magnetic field control apparatus as recited in claim 9, wherein each of said rings has eight segments.

12. A magnetic field control apparatus as recited in claim 9, wherein said segments of each respective said ring have substantially identical shapes.

13. A magnetic field control apparatus as recited in claim 9, wherein each of said segments is arcuate is shape.

14. A magnetic field control apparatus as recited in claim 9, wherein said pole face and segments are made of ferrous material.

15. A magnetic field control apparatus as recited in claim 9, further comprising a plurality of said inner rings, each of said inner rings being mounted on a respective said pole face concentrically with respective said outer ring.

* * * * *